(12) United States Patent
An et al.

(10) Patent No.: US 12,414,256 B2
(45) Date of Patent: Sep. 9, 2025

(54) CAM LATCHING DEVICE

(71) Applicant: ZT GROUP INT'L, INC., Secaucus, NJ (US)

(72) Inventors: Chen An, Bergenfield, NJ (US); Yuan Zhang, North Bergen, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 226 days.

(21) Appl. No.: 18/446,013

(22) Filed: Aug. 8, 2023

(65) Prior Publication Data

US 2025/0056752 A1    Feb. 13, 2025

(51) Int. Cl.
*H05K 7/14* (2006.01)
*F16B 2/18* (2006.01)

(52) U.S. Cl.
CPC .............. *H05K 7/1489* (2013.01); *F16B 2/18* (2013.01)

(58) Field of Classification Search
CPC ........................... H05K 7/1409; H05K 7/1489
See application file for complete search history.

(56) References Cited

U.S. PATENT DOCUMENTS

| | | | | |
|---|---|---|---|---|
| 6,220,879 B1* | 4/2001 | Ulrich | ................. | H05K 7/1409 439/341 |
| 6,549,424 B1* | 4/2003 | Beseth | ................. | H05K 7/1409 361/801 |
| 6,790,068 B2* | 9/2004 | Westphall | ............ | H05K 7/1409 439/325 |
| 7,245,499 B2* | 7/2007 | Stahl | ................... | H05K 7/1409 361/740 |
| 7,292,457 B2* | 11/2007 | DeNies | ................ | H05K 7/1461 361/801 |
| 8,054,638 B2* | 11/2011 | Graybill | .............. | H05K 7/1489 361/740 |
| 8,289,707 B2* | 10/2012 | Liao | ..................... | H05K 7/1411 361/726 |
| 8,416,563 B2* | 4/2013 | Hou | ..................... | H05K 7/1489 361/679.33 |
| 8,605,440 B2* | 12/2013 | Gong | .................. | H05K 7/1409 361/726 |
| 9,125,318 B2* | 9/2015 | French, Jr. | ........... | H05K 7/1489 |
| 9,999,154 B2* | 6/2018 | Frank | ................... | H05K 5/0208 |
| 10,080,300 B1* | 9/2018 | Olesiewicz | .......... | H05K 7/1402 |
| 10,165,709 B2* | 12/2018 | Schmidtke | ............. | H04L 49/15 |

(Continued)

*Primary Examiner* — Adrian S Wilson
(74) *Attorney, Agent, or Firm* — SCULLY, SCOTT, MURPHY & PRESSER, P.C.

(57) ABSTRACT

A cam latching device is provided for a computing system being installed in a rack. The cam latching device can include a cam and a locking mechanism. The cam includes a handle portion and an engagement portion. The cam includes a locking surface formed thereon. Rotation of the handle portion causes the engagement portion to rotate. The locking mechanism includes a push component and a lock. The push component abuts against a button disposed on a rail of the rack as the computing system translates along a longitudinal axis. When the push component slides against the button, the locking mechanism transitions from a locked configuration to an unlocked configuration. In the locked configuration, the lock abuts against the locking surface to prevent the rotation of the cam. In the unlocked configuration, the lock is retracted away from the locking surface so that the cam is rotatable.

20 Claims, 12 Drawing Sheets

(56) References Cited

U.S. PATENT DOCUMENTS

| | | | | |
|---|---|---|---|---|
| 10,383,248 B1* | 8/2019 | Chen | H05K 7/18 |
| 10,396,497 B1* | 8/2019 | Bame | H05K 7/1409 |
| 10,827,641 B1* | 11/2020 | Shen | H05K 7/20709 |
| 11,160,190 B1* | 10/2021 | Leung | H04Q 1/15 |
| 11,441,329 B2* | 9/2022 | Tseng | E05B 13/10 |
| 12,207,440 B2* | 1/2025 | An | F16L 37/30 |
| 2004/0264146 A1* | 12/2004 | Kerrigan | H05K 7/1489 |
| | | | | 361/726 |
| 2012/0127658 A1* | 5/2012 | Hartman | G06F 1/187 |
| | | | | 29/428 |
| 2013/0107424 A1* | 5/2013 | Thomas | H05K 7/1489 |
| | | | | 361/679.01 |
| 2016/0157610 A1* | 6/2016 | Chen | A47B 88/43 |
| | | | | 248/219.3 |

* cited by examiner

CAM LATCHING DEVICE

FIELD

The present disclosure relates generally to a cam latching device operable to assist with installation of a computing system in a rack.

BACKGROUND

As racks become increasingly low-profile, traditional mounting features are no longer compatible with newer racks that lack front mount EIA posts. To address this issue, heavy HPCs typically use a cam handle to facilitate server engagement in the end position, ensuring stable power and data connections.

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Computing systems such as integrated just a bunch of discs (JBOD) or just a bunch of GPUs (JBOG) need a large insertion and ejection force to allow power bar clip connection to a rack. Conventional latching devices do not provide enough mechanical advantage so that insertion force has a high chance of exceeding 50 pounds. Cam handles can facilitate server engagement in the end position, ensuring stable power and data connections.

The cam latching device disclosed herein includes a long moment arm with a handle portion for enhanced mechanical advantage, allowing for easier system engagement and ensuring electrical connection quality for system integrator improvement and power connection. Additionally, for liquid cooling high performing computing systems, the cam latching device can also ensure easy quick disconnect mating and maintain connecting quality. Conventional cam devices may inadvertently cause the handle portion to rotate towards a closed position during sliding of the computing system in the rack before the cam is fully engaged, potentially leading to conflicts and cam damage.

To resolve this challenge, the present disclosure provides a cam latching device that has a locking mechanism that enables the handle portion to remain open during translation, sliding, or insertion of the computing system into the rack. The handle portion, and consequently the engagement portion, only rotates after reaching the actuating point on the rack when the computing system is fully received in the rack. The present cam latching device ensures a smooth cam engagement process, preventing damage, cable grabbing (when the cam hook travels across the cable management channel), and conflicts.

Figure 1A:
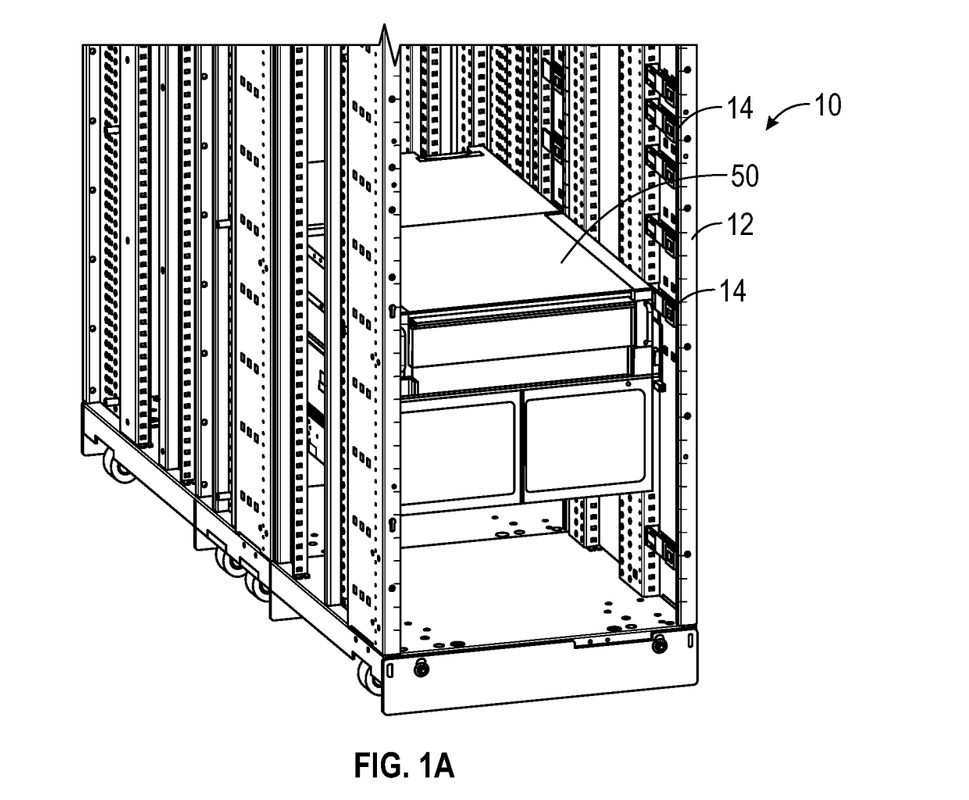
FIG. 1A illustrates server system with a rack having a computing system installed therein.

FIG. 1A illustrates a server system 10 that includes a rack 12 that is operable to receive one or more computing systems 50. The computing system 50 can include, for example, integrated just a bunch of discs (JBOD) or just a bunch of GPUs (JBOG). The rack 12 can include a plurality of rails 14 that are operable to receive the computing system(s) 50. The computing systems 50 can be received by the corresponding rails 14, and translated along the rails 14 along a longitudinal axis until fully received in the rack 12. Once fully received in the rack 14, the computing system 50 can then be fully installed by connecting components, for example liquid cooling (e.g., via quick disconnect mating).

Figure 1B:
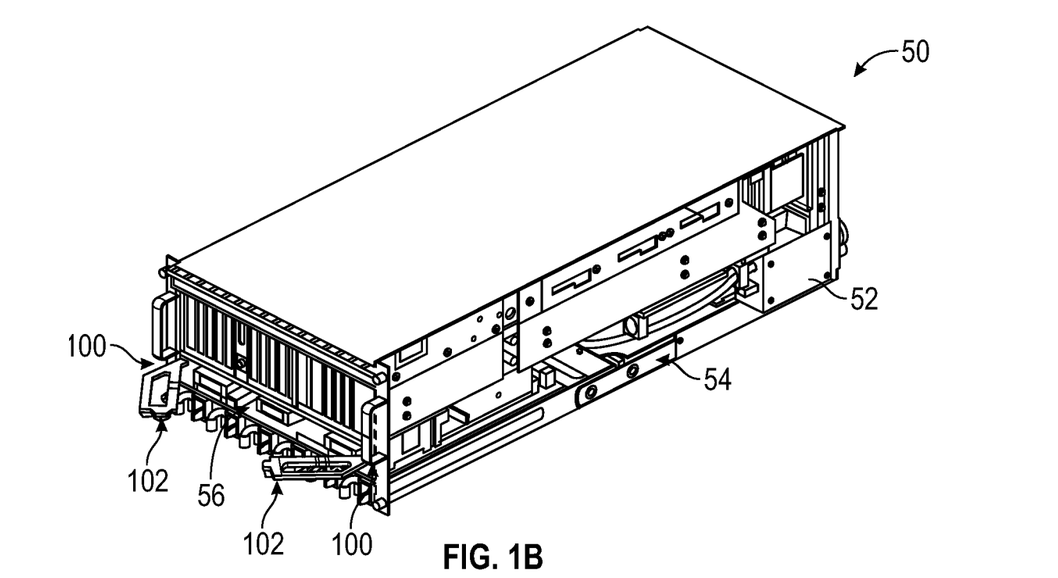
FIG. 1B illustrates a computing system with a cam latching device.

As illustrated in FIG. 1B, the computing system 50 can include a chassis 52. The chassis 52 can have sides 54 and a front 56 that spans the sides 54. The chassis 52 can be operable to receive a plurality of computing components, such as one or more processors, one or more motherboards, one or more fans, one or more hard drives, etc.

A cam latching device 100 can be coupled with the computing system 50. In at least one example, the cam latching device 100 can be coupled with the chassis 52. A handle portion 104 of a cam 102 for the cam latching device 100 can extend from the front 56 of the chassis 52. Accordingly, a user can utilize a handle portion 104 of a cam 102 to insert the computing system 50 into the rack 12 and impart a push force to translate the chassis 52 of the computing system 50, which in some examples can weigh over 300 pounds, along the longitudinal axis into the rack 12 for installation.

Figure 2A:
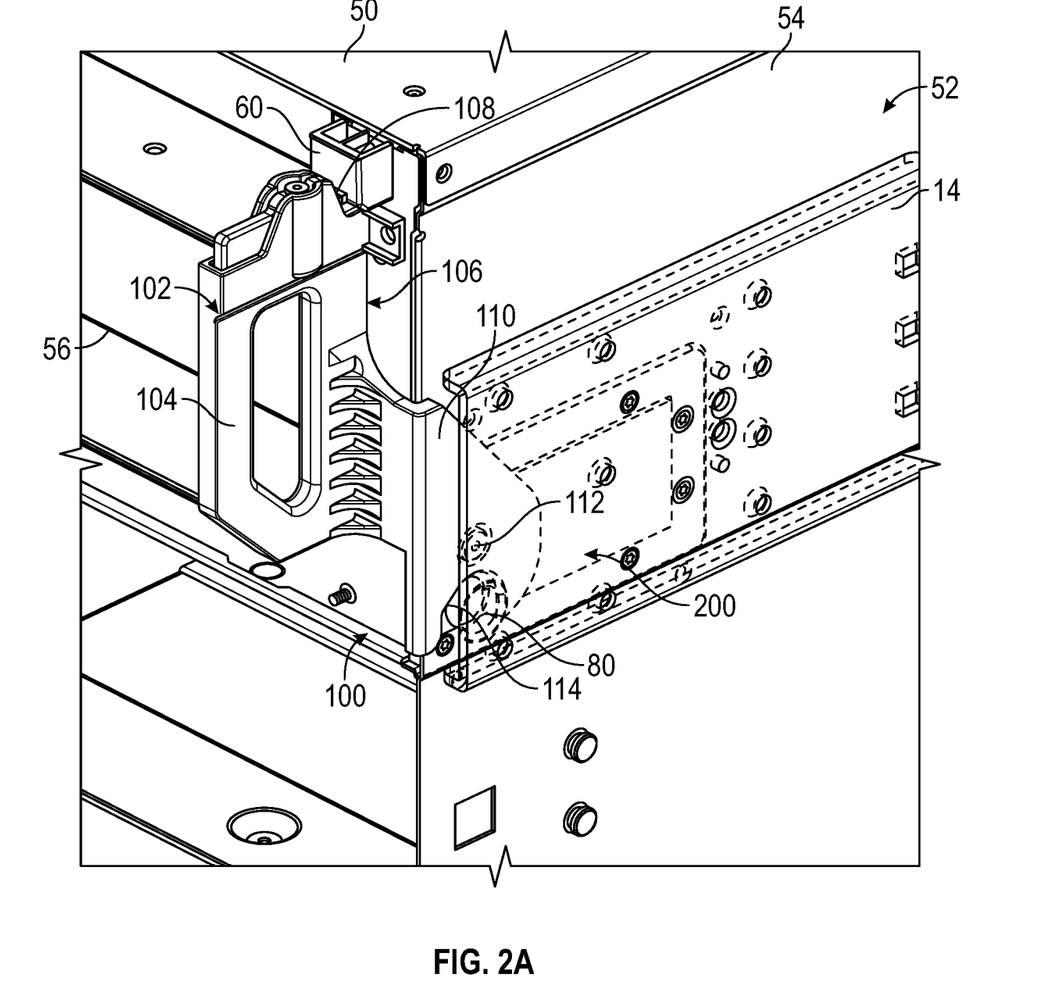
FIG. 2A illustrates a cam latching device interacting with a rail of the rack.

FIG. 2A illustrates the cam latching device 100. As shown in FIG. 2A, the cam latching device 100 includes a cam 102 and a locking mechanism 200. The cam 102 includes the handle portion 104 and an engagement portion 110. In some examples, the handle portion 104 can be coupled with the engagement portion 110. In some examples, the handle portion 104 and the engagement portion 110 can be one integrated component. The handle portion 104 is configured to allow a user to grip the handle portion 104 and impart the push force, for example exceeding 50 pounds, to translate the computing system 50 along the rails 14 of the rack 12. The handle portion 104 can have a chassis surface 106 which is operable to abut against the front 56 of the chassis 52 when the handle portion 104 is rotated to couple the computing system 50 with the rack 12 for installation via the engagement portion 110. In at least one example, a receiving component 60 can be coupled to the front 56 of the chassis 52. In some examples, the receiving component 60 can be formed as a portion of the front 56 of the chassis 52. The receiving component 60 can be operable to receive and abut against an abutment surface 108 of the handle portion 104 when the handle portion 104 is rotated to couple the computing system 50 with the rack 12 for installation via the engagement portion 110.

The engagement portion 110 can be rotatably coupled with the chassis 52. In at least one example, as illustrated in FIG. 2A, the engagement portion 110 can be rotatably coupled with a side 54 of the chassis 52. In some examples, the engagement portion 110 can be rotatably coupled with the chassis 52 via a rotation point 112. In some examples, the rotation point 112 can include any one of the following: a bolt, a screw, a nail, or any other suitable mechanism. When the handle portion 104 is rotated, the engagement portion 110 can be rotated about the rotation point 112.

The engagement portion 110 can be operable to engage with a guide 80 included on the rack 12. In at least one example, the guide 80 can be coupled with the rail 14. When the engagement portion 110 is engaged with the guide 80, the computing system 50 is latched onto the rack 12 for secure installation.

In at least one example, the engagement portion 110 can form an engagement surface 114 operable to receive and interact with the guide 80. The engagement surface 114 can have a compound curve so that when the engagement surface 114 of the engagement portion 110 engages with the guide 80 and transitions towards a latched configuration, the cam 102 translates the chassis 52 of the computing system 50 along the longitudinal axis. In other words, the cam 102 converts the rotational force to a linear force due to the compound curve of the engagement surface 114.

Figure 2B:
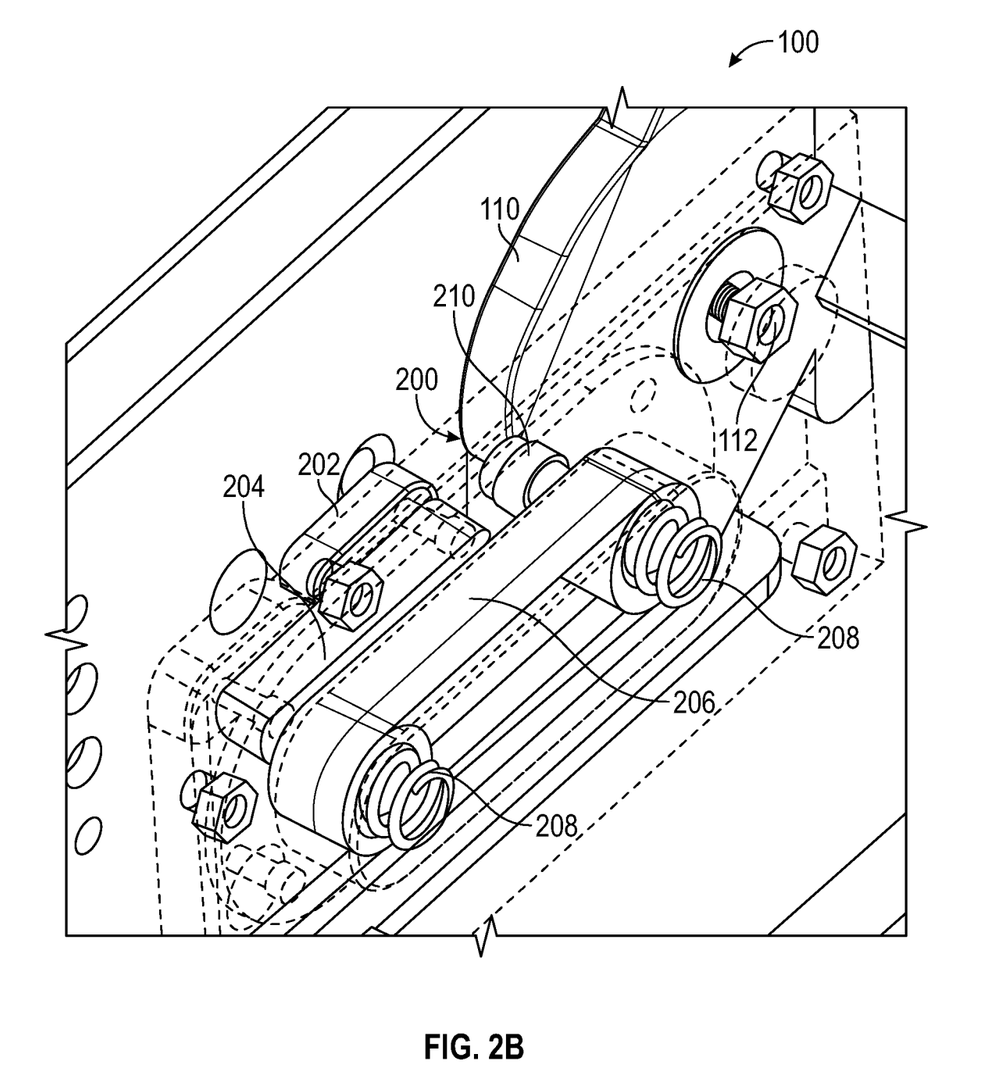
FIG. 2B illustrates the cam latching device.

FIG. 2B illustrates the locking mechanism 200. The locking mechanism 200 includes a push component 204 with a push surface 2040 (as shown in FIGS. 3C, 4C, 5C, 7A, 8A, and 9A) and a lock 210. The push surface 2040 of the push component 204 can be operable to abut against a button 202 disposed on the rail 14 of the rack 12 as the computing system 50 translates along the longitudinal axis to be installed in the rack 12. When the push surface 2040 of the push component 204 slides against the button 202, the locking mechanism 200 transitions from a locked configuration to an unlocked configuration. When the locking mechanism 200 is in the locked configuration, the lock 210 is operable to abut against a locking surface 1100 of the engagement portion 110 of the cam 102 to prevent the rotation of the handle portion 104 and the engagement portion 110. When the locking mechanism 200 is in the unlocked configuration, the lock 210 is retracted away from the locking surface 1100 so that the handle portion 104 and the engagement portion 110 are rotatable.

In at least one example, as illustrated in FIG. 2B, the locking mechanism 200 can include one or more springs 208. While FIG. 2B illustrates two springs 208, the locking mechanism 200 can include one, three, or more springs 208 without deviating from the scope of the disclosure. When the push surface 2040 of the push component 204 slides against the button 202 to transition the locking mechanism 200 to the unlocked configuration, the springs 208 can be compressed. When the push component 204 does not contact the button 202, the springs 208 can be not compressed and maintain the position of the lock 210 against the locking surface 1100 of the cam 102. As the lock 210 moves in coordination with the springs 208, the lock 210 retracts when the springs 208 are compressed and extends when the springs 208 are not compressed. In some examples, the lock 210 can be coupled with the push component 204. In some examples, as illustrated in FIG. 2B, the locking mechanism 200 can include a body 206 coupled with the push component 204 and the lock 210. The body 206 can be configured to receive the springs 208. Accordingly, when the push component 204 slides against the button 202 to transition the locking mechanism 200 to the unlocked configuration, the body 206 pushes against the one or more springs 208 to compress the springs 208 and retracts the lock 210 from the locking surface 1100. In some examples, when the lock 210 is retracted, the lock 210 can be moved towards the chassis 52 of the computing system 50. In some examples, the lock 210 can change in shape and/or size, to be retracted away from the locking surface 1100. For example, the lock 210 can telescope to be extended out to abut against the locking surface 1100 and retract back to a smaller length to not abut against the locking surface 1100.

In at least one example, the locking mechanism 200 can be coupled with the computing system 50, for example the chassis 52. In some examples, the locking mechanism 200 can be coupled with the side 54 of the chassis 52. In some examples, the locking mechanism 200 can be coupled with the cam 102. For example, as illustrated in FIG. 2B, the locking mechanism 200 can be coupled with the engagement portion 110 of the cam 102.

Figure 3A:
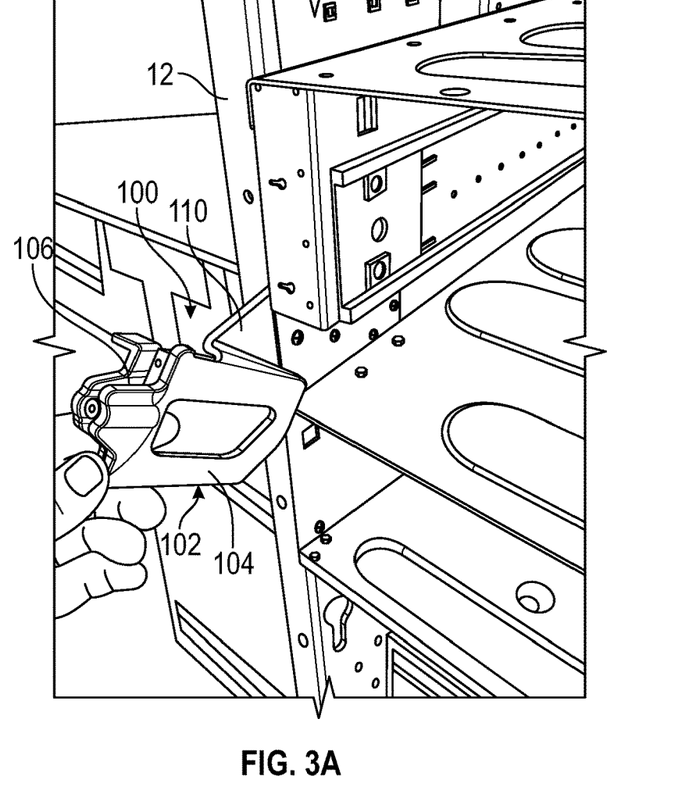
FIG. 3A illustrates the computing system with the cam latching device being inserted into the rack.
Figure 3B:
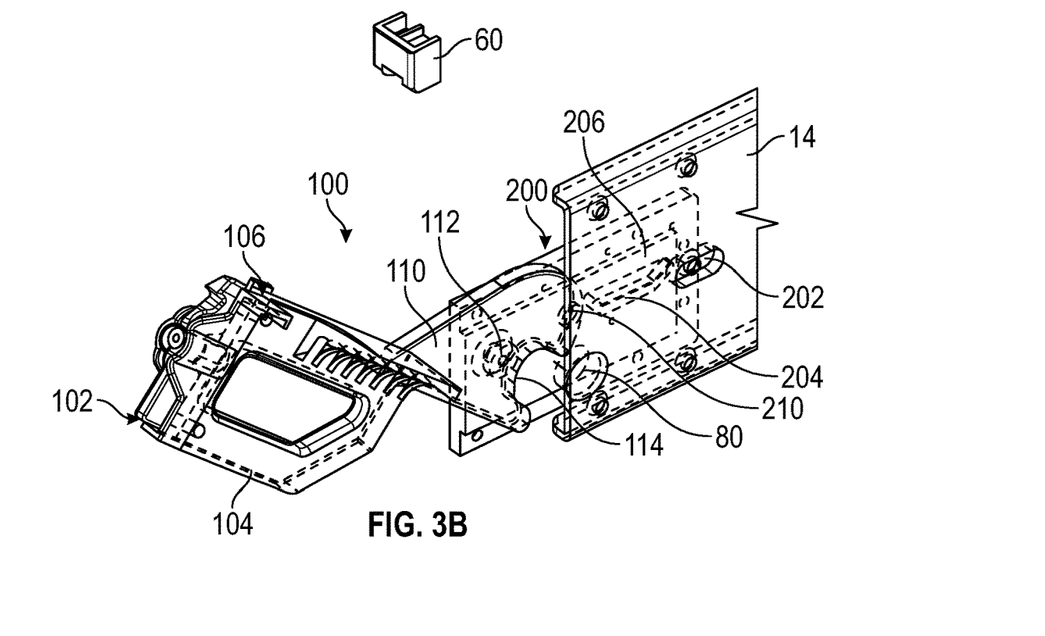
FIG. 3B illustrates the cam latching device as utilized in FIG. 3A.
Figure 3C:
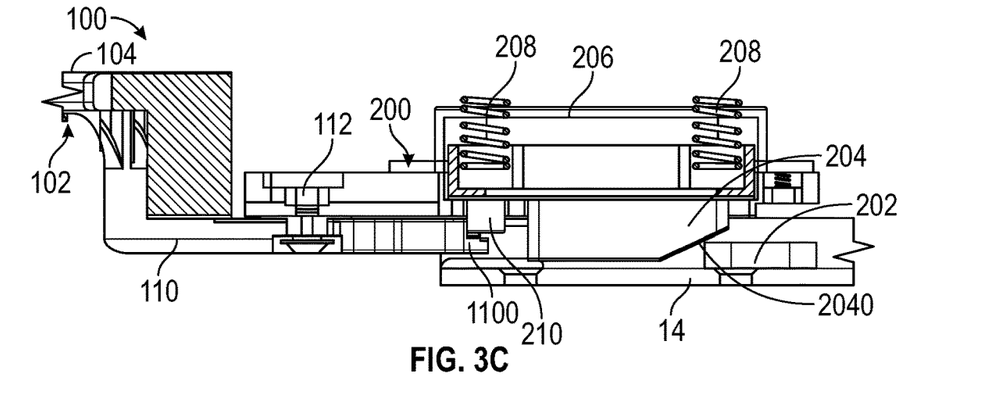
FIG. 3C illustrates a top view of the cam latching device as in FIGS. 3A and 3B.

FIGS. 3A, 3B, and 3C illustrate the cam latch device 100 being utilized by a user to push the computing system 50 into the rack 12 for installation. The user is imparting the push force on the handle portion 104 of the cam 102 to translate the computing system 50 along the longitudinal axis into the rack 12. The locking mechanism 200 is in the locked configuration so that the handle portion 104 cannot rotate. Accordingly, the user can effectively impart the push force onto the computing system 50 without damaging the cam 102, the rail 14, the rack 12, and/or any other components. The push force can then be translated from the user to the handle portion 104 to the chassis 52 of the computing system 50 effectively, efficiently, and consistently.

As the chassis 52 of the computing system 50 has not yet been fully received in the rack 12, the push surface 2040 of the push component 204 has not yet contacted the button 202 on the rack 12. Accordingly, the locking component 200 is in the locked configuration such that the handle portion 104 and the engagement portion 110 are prevented from rotating. The lock 210 abuts against the locking surface 1100 of the cam 102 to prevent the rotation of the cam 102. For example, as illustrated in FIG. 3C, the springs 208 are not compressed, so the lock 210 is extended and abuts against the locking surface 1100. The locking mechanism 200, with the springs 208, defaults to the locked configuration to prevent rotation of the handle portion 104 and the engagement portion 110 which can avoid the engagement portion 110 from getting caught by the guide 80.

Figure 4A:
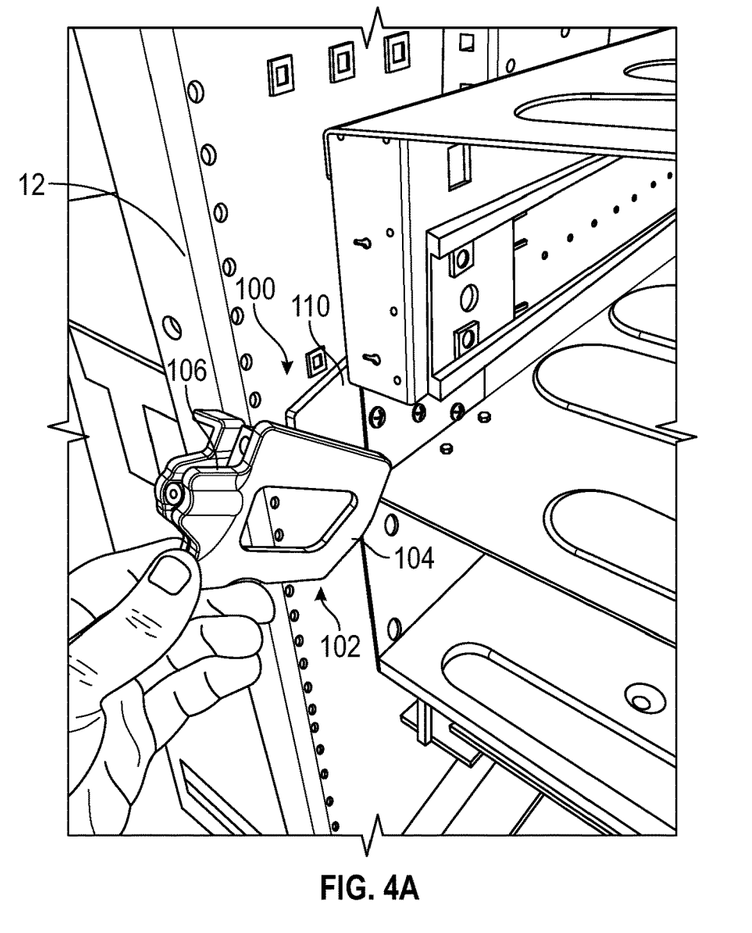
FIG. 4A illustrates the computing system fully inserted into the rack.
Figure 4B:
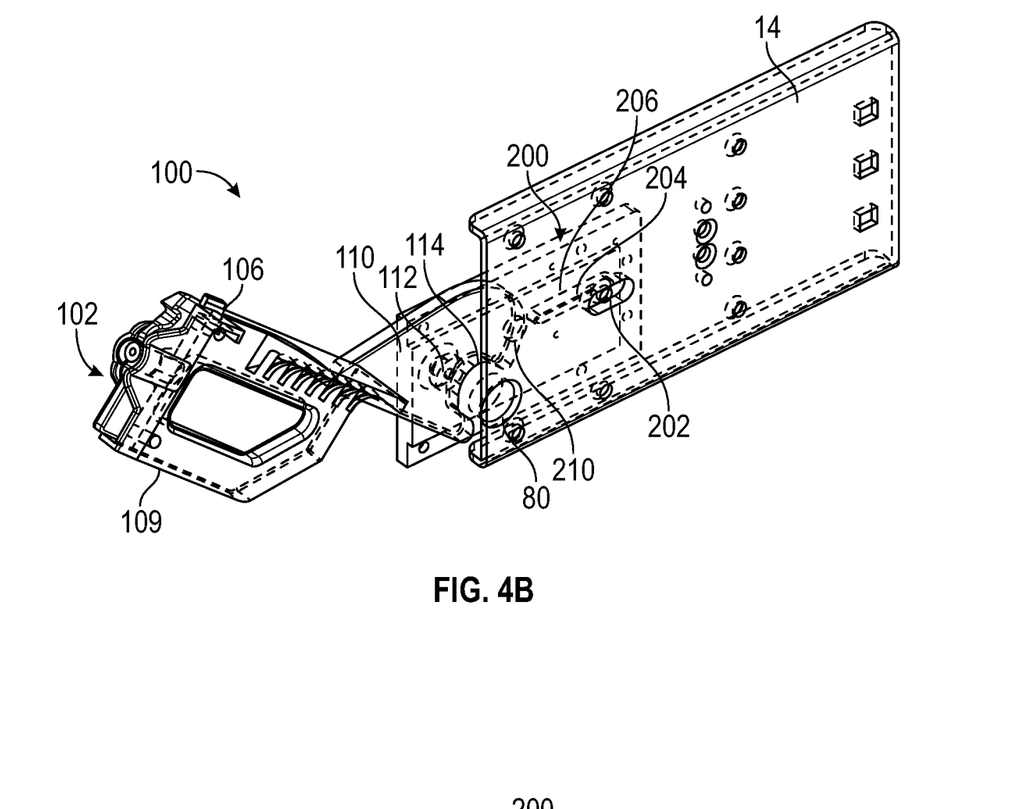
FIG. 4B illustrates the cam latching device as utilized in FIG. 4A.
Figure 4C:
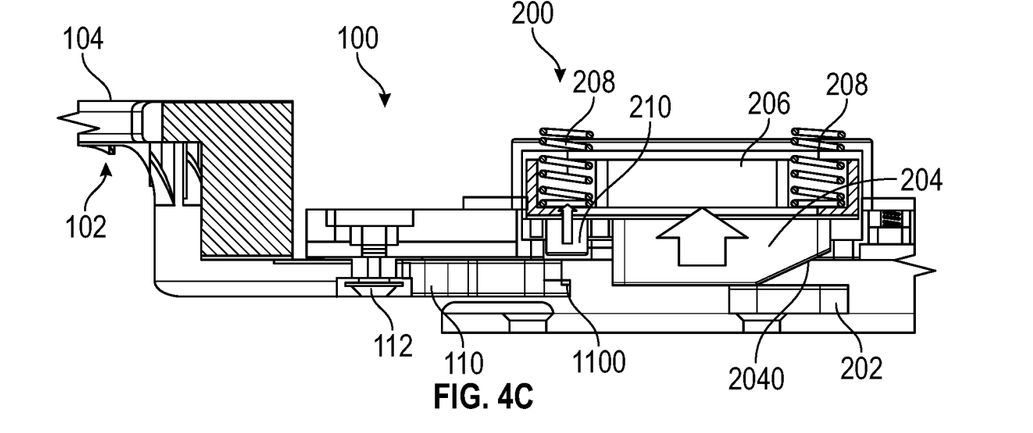
FIG. 4C illustrates a top view of the cam latching device as in FIGS. 4A and 4B.

FIGS. 4A, 4B, and 4C illustrate the chassis 52 of the computing system 50 being almost fully received in the rack 12 for installation. The button 202 is abutting against and sliding across the push surface 2040 of the push component 204. In at least one example, as illustrated in FIG. 4C, the push surface 2040 can be angled. In some examples, the push surface 2040 can be curved. Accordingly, the button 202 can abut against and smoothly slide across the push surface 2040 of the push component 204 to compress the springs 208. As the springs 208 are compressed, the push component 204 and the body 206 retract towards the chassis 52 (e.g., away from the rail 14). As the lock 210 is corresponding with the push component 204 and/or the body 206, the lock 210 begins to retract away from the locking surface 1100 to transition the locking mechanism 200 towards the unlocked configuration. As illustrated in FIG. 4C, the lock 210, similar to the push component 204 and/or the body 206, moves towards the chassis 52 and away from the rail 14. Once the lock 210 is fully separated from the locking surface 1100, the locking mechanism 200 is in the unlocked configuration, and the cam 102 (e.g., the handle portion 104 and the engagement portion 110) can rotate to latch the computing system 50 in the rack 14.

Figure 5A:
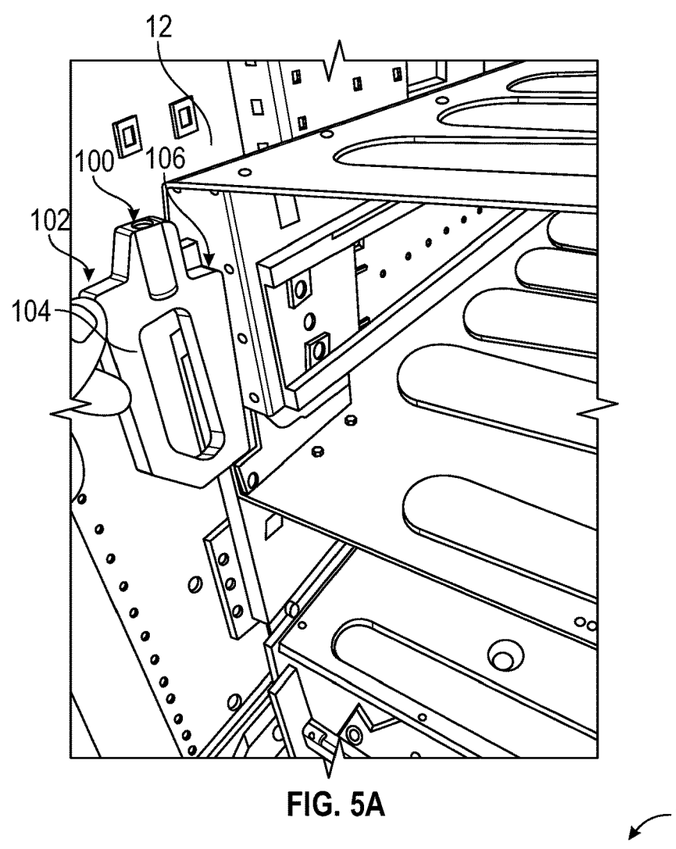
FIG. 5A illustrates the cam latching device transitioned to a locked configuration.
Figure 5B:
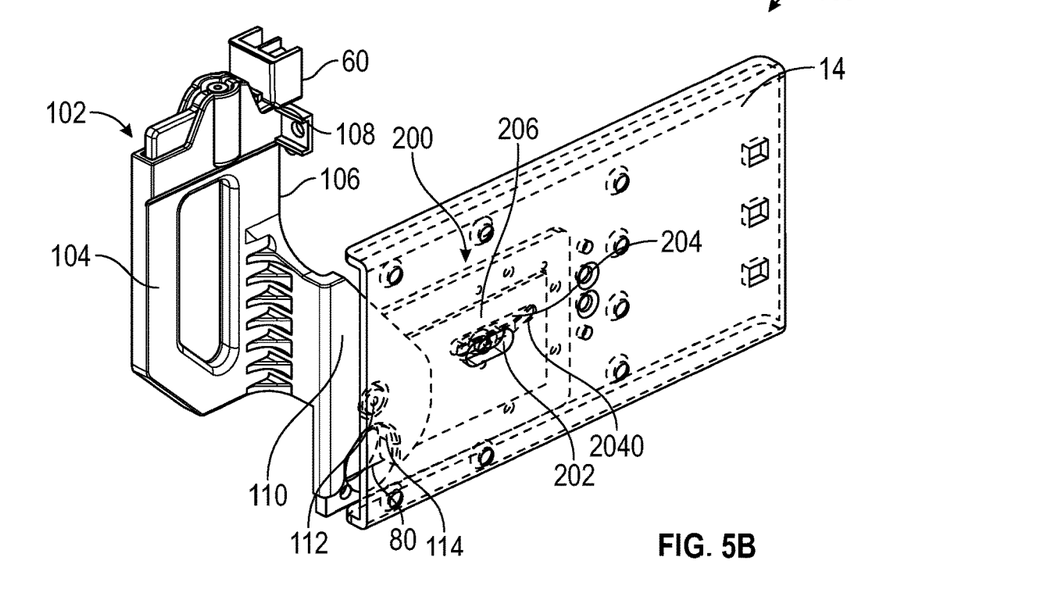
FIG. 5B illustrates the cam latching device as utilized in FIG. 5A.
Figure 5C:
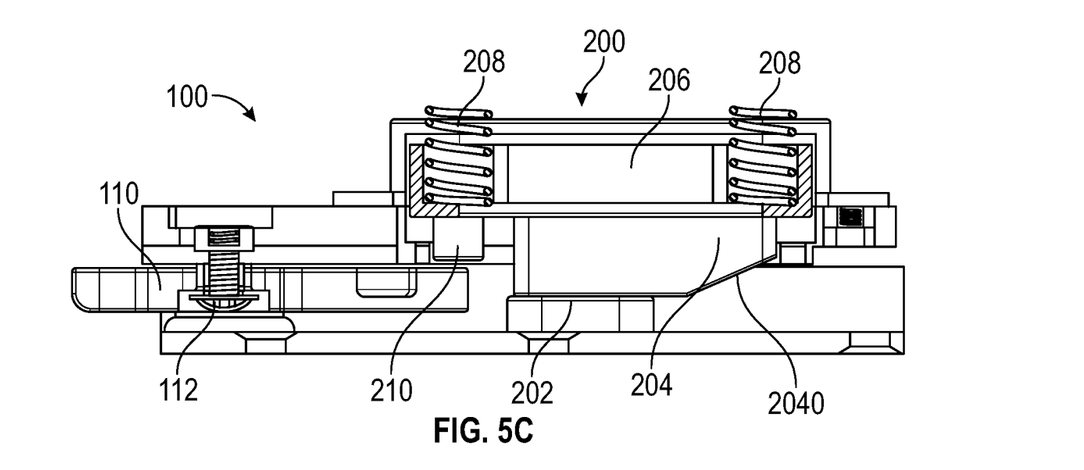
FIG. 5C illustrates a top view of the cam latching device as in FIGS. 5A and 5B.

FIGS. 5A, 5B, and 5C illustrate the chassis 52 of the computing system 50 being fully inserted into the rack 14, and the cam 102 has latched the computing system 50 in the rack 14. Accordingly, the computing system 50 is coupled with the rack 14. As shown in FIG. 5C, the button 202 is fully abutting the push component 204, the springs 208 are compressed, and the lock 210 is separated and not abutting the locking surface 1100.

FIGS. 6A-9B illustrate another example of a cam latching device 100. The cam latching device 100 in FIGS. 6A-9B have the same components and operation as the cam latching device 100 as shown and described in FIGS. 3A-5C, but is oriented so that the handle portion 104 is horizontal instead of vertical as in FIGS. 3A-5C. This slightly alters the arrangement of the components of the cam latching device 100, but does not alter the operation of the components.

Figure 6A:
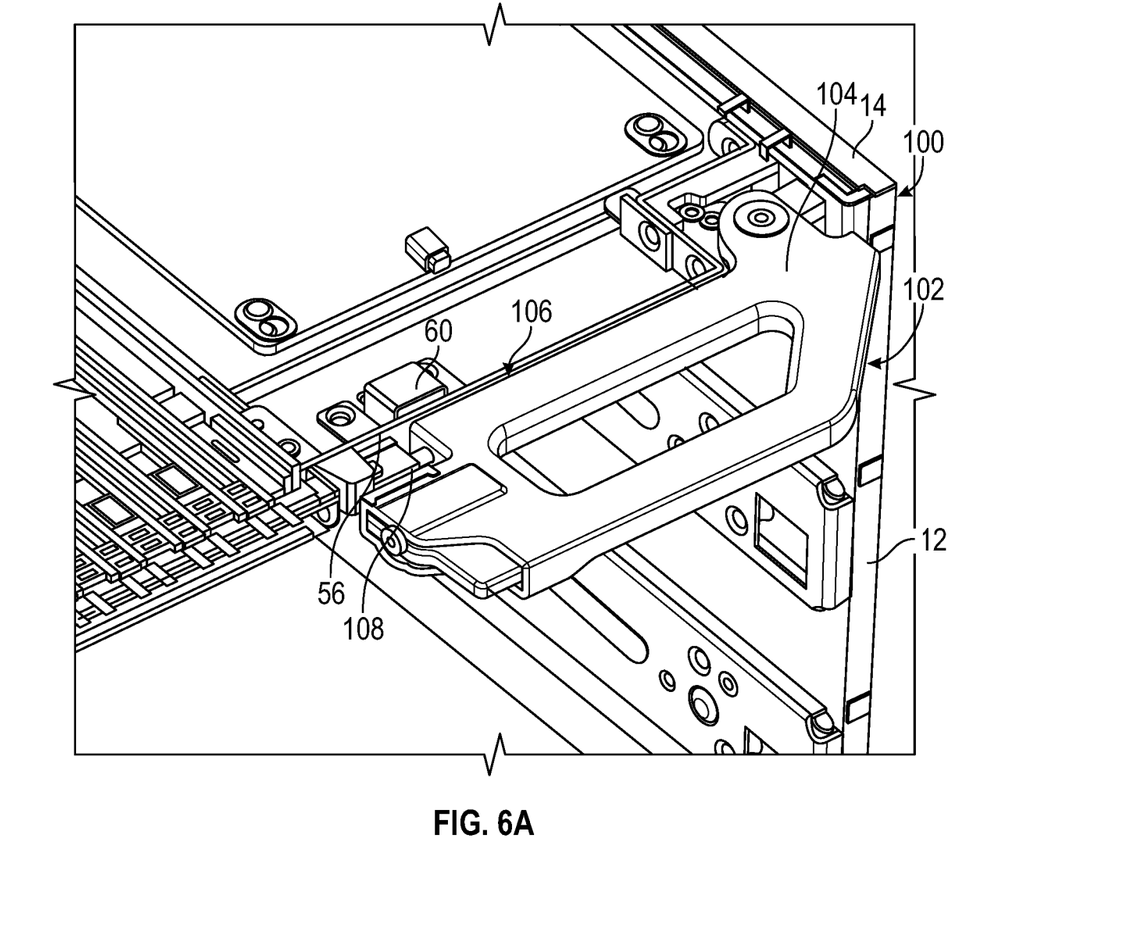
FIGS. 6A and 6B illustrate another examples of a cam latching device.
Figure 6B:
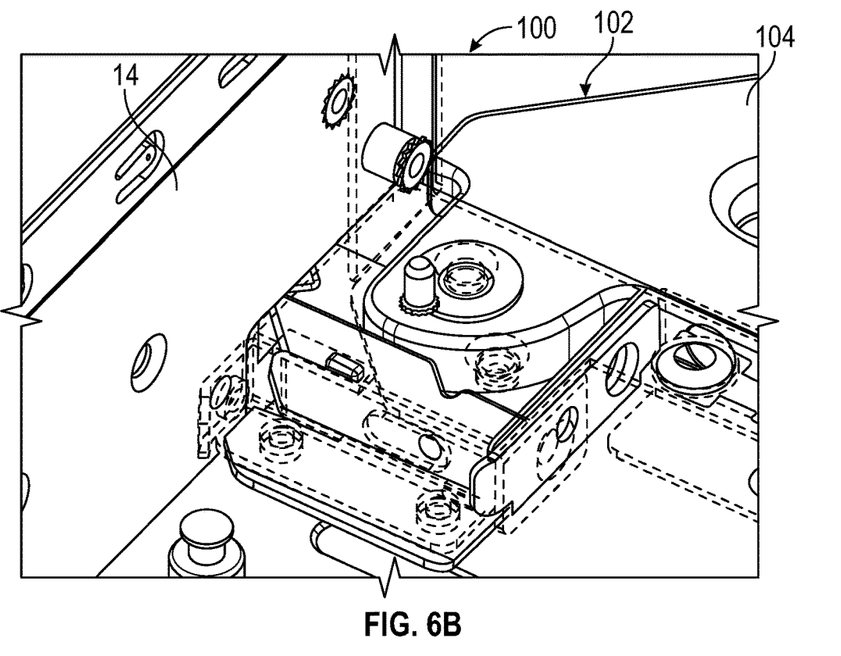

As illustrated in FIGS. 6A and 6B, the cam latching device 100 includes the cam 102 which includes the handle portion 104 and the engagement portion 110.

Figure 7A:
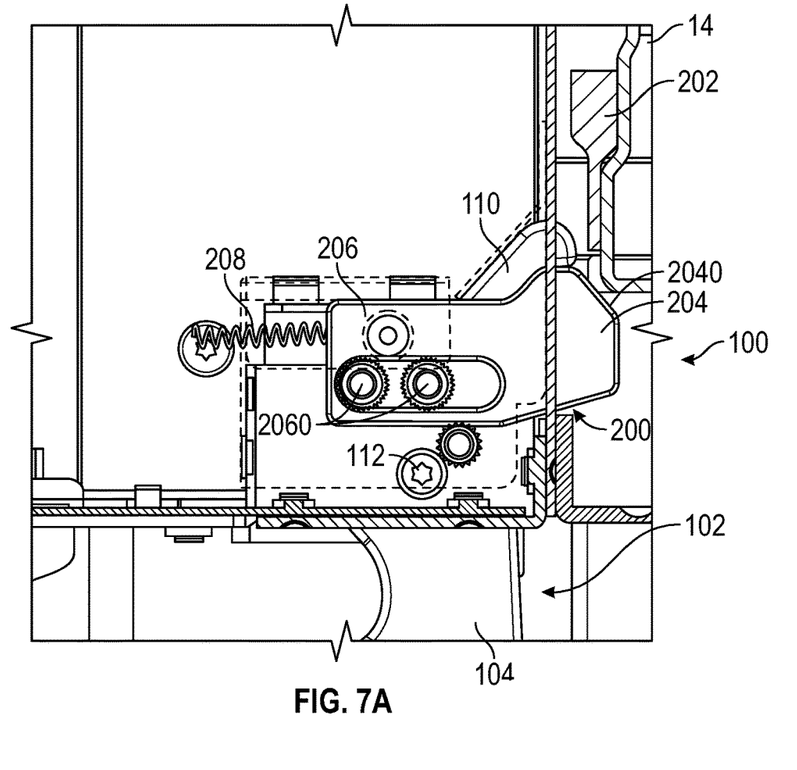
FIG. 7A illustrates the cam latching device as the computing system is inserted into the rack.
Figure 7B:
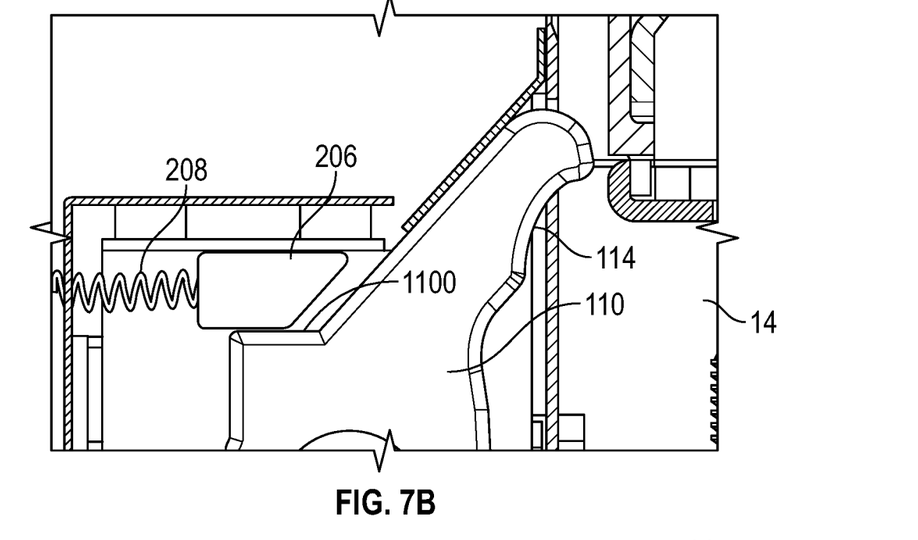
FIG. 7B illustrates an opposing view of FIG. 7A.

FIGS. 7A and 7B are similar to FIGS. 3A-3C, the cam latch device 100 is being utilized by a user to push the computing system 50 into the rack 12 for installation, as the computing system 50 has not yet been fully received in the rack 12. The locking mechanism 200 is in the locked configuration so that the handle portion 104 cannot rotate. Accordingly, the user can effectively impart the push force onto the computing system 50 without damaging the cam 102, the rail 14, the rack 12, and/or any other components. The push force can then be translated from the user to the handle portion 104 to the chassis 52 of the computing system 50 effectively, efficiently, and consistently.

As the chassis 52 of the computing system 50 has not yet been fully received in the rack 12, the push surface 2040 of the push component 204 has not yet contacted the button 202 on the rack 12. Accordingly, the locking component 200 is in the locked configuration such that the handle portion 104 and the engagement portion 110 are prevented from rotating. The lock 210 abuts against the locking surface 1100 of the cam 102 to prevent the rotation of the cam 102. For example, as illustrated in FIGS. 7A and 7B, the springs 208 are not compressed, so the lock 210 is extended and abuts against the locking surface 1100. The locking mechanism 200, with the springs 208, defaults to the locked configuration to prevent rotation of the handle portion 104 and the engagement portion 110 which can avoid the engagement portion 110 from getting caught by the guide 80.

Figure 8A:
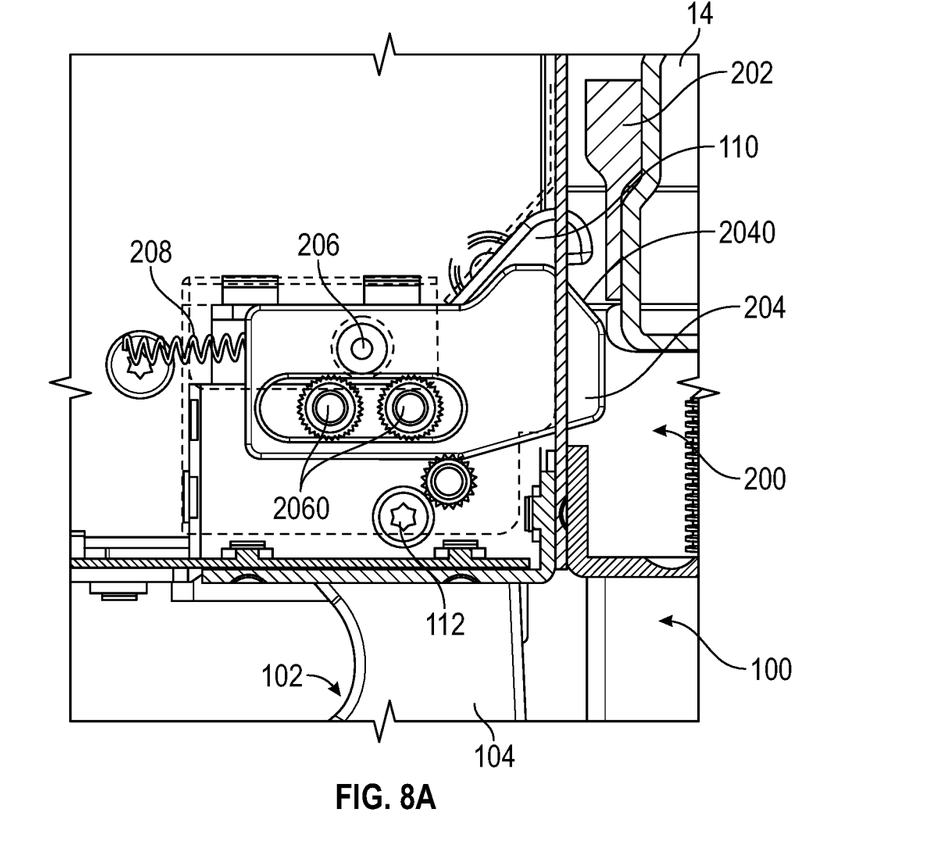
FIG. 8A illustrates the cam latching device as the computing system is fully inserted into the rack.
Figure 8B:
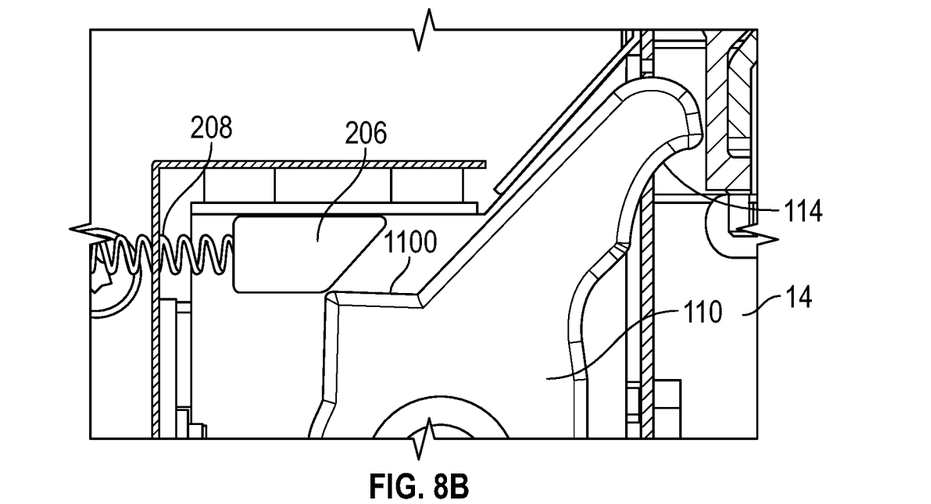
FIG. 8B illustrates an opposing view of FIG. 8A.

FIGS. 8A and 8B illustrate the chassis 52 of the computing system 50 being almost fully received in the rack 12 for installation. The button 202 is abutting against and sliding across the push surface 2040 of the push component 204. In at least one example, as illustrated in FIGS. 8A, the push surface 2040 can be angled. In some examples, the push surface 2040 can be curved. Accordingly, the button 202 can abut against and smoothly slide across the push surface 2040 of the push component 204 to compress the springs 208. As the springs 208 are compressed, the push component 204 and the body 206 retract towards the chassis 52 (e.g., away from the rail 14). As the lock 210 is corresponding with the push component 204 and/or the body 206, the lock 210 begins to retract away from the locking surface 1100 to transition the locking mechanism 200 towards the unlocked configuration. As illustrated in FIG. 8B, the lock 210, similar to the push component 204 and/or the body 206, moves towards the chassis 52 and away from the rail 14. Once the lock 210 is fully separated from the locking surface 1100, the locking mechanism 200 is in the unlocked configuration, and the cam 102 (e.g., the handle portion 104 and the engagement portion 110) can rotate to latch the computing system 50 in the rack 14.

Figure 9A:
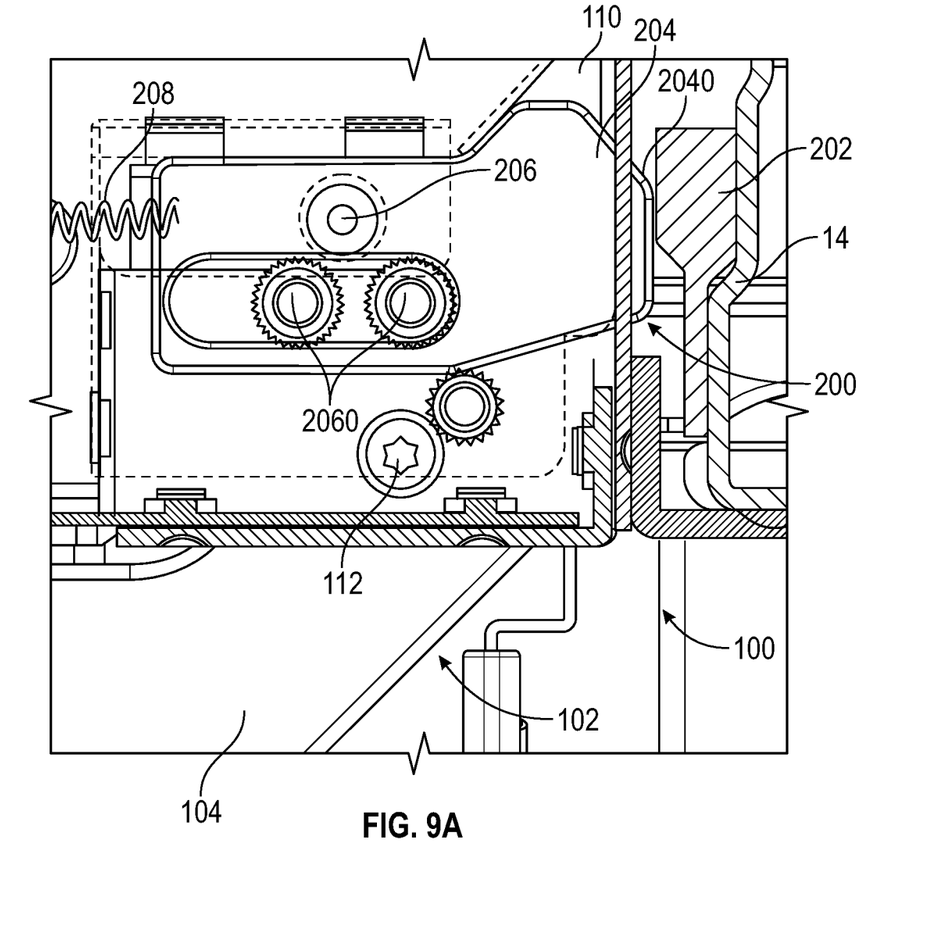
FIG. 9A illustrates the cam latching device transitioned to the locked configuration.
Figure 9B:
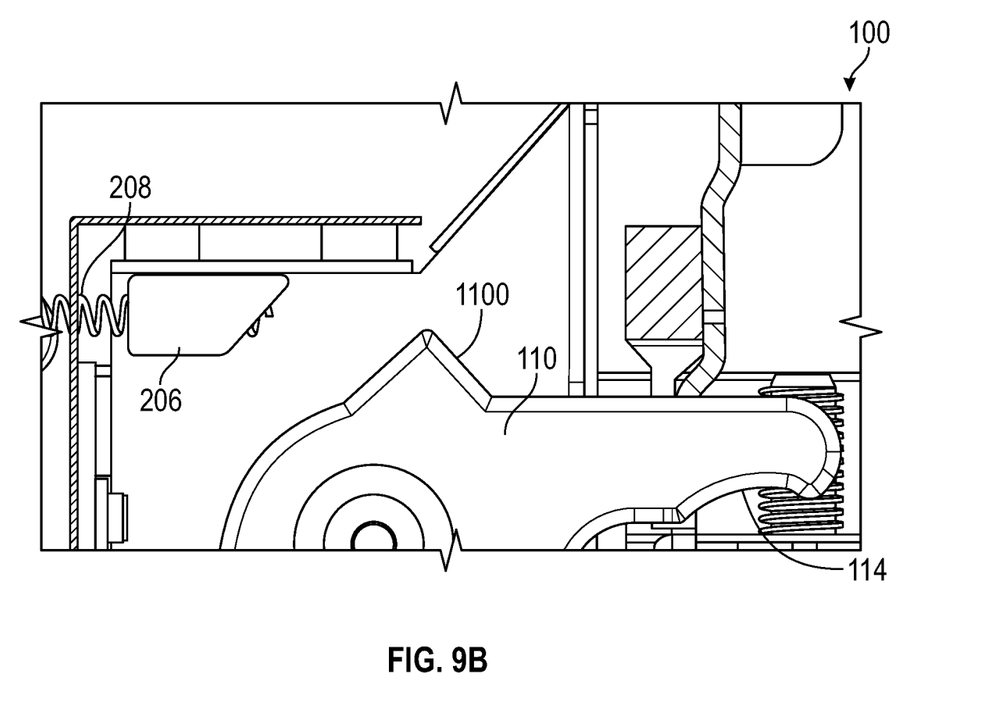
FIG. 9B illustrates an opposing view of FIG. 9A.

FIGS. 9A and 9B illustrate the chassis 52 of the computing system 50 being fully inserted into the rack 14, and the cam 102 has latched the computing system 50 in the rack 14. Accordingly, the computing system 50 is coupled with the rack 14. As shown in FIG. 9A, the button 202 is fully abutting the push component 204, the springs 208 are compressed, and as shown in FIG. 9B, the lock 210 is separated and not abutting the locking surface 1100. Accordingly, the cam 102 (e.g., the handle portion 104 and the engagement portion 110) have been rotated to latch the computing system 50 in the rack 14.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A cam latching device for a computing system being installed in a rack, the cam latching device comprising:
   a cam including a handle portion and an engagement portion, the cam including a locking surface formed thereon, wherein rotation of the handle portion causes the engagement portion to rotate; and
   a locking mechanism including a push component and a lock, the push component operable to abut against a button disposed on a rail of the rack as the computing system translates along a longitudinal axis to be installed in the rack, wherein when the push component slides against the button, the locking mechanism transitions from a locked configuration to an unlocked configuration,
   wherein when the locking mechanism is in the locked configuration, the lock is operable to abut against the locking surface to prevent the rotation of the handle portion and the engagement portion, and
   wherein when the locking mechanism is in the unlocked configuration, the lock is retracted away from the locking surface so that the handle portion and the engagement portion are rotatable.

2. The cam latching device of claim 1, wherein the locking mechanism includes one or more springs, wherein when the push component slides against the button to transition the locking mechanism to the unlocked configuration, the springs are compressed.

3. The cam latching device of claim 2, wherein when the push component does not contact the button, the one or more springs are not compressed and maintain the position of the lock against the locking surface of the cam.

4. The cam latching device of claim 2, wherein the locking mechanism includes a body coupled with the push component and the lock, wherein the body is configured to receive the one or more springs.

5. The cam latching device of claim 4, wherein when the push component slides against the button to transition the locking mechanism to the unlocked configuration, the body pushes against the one or more springs to compress the one or more springs and retracts the lock from the locking surface.

6. The cam latching device of claim 1, wherein when the handle portion is rotated, the engagement portion is rotated to engage with a guide to maintain the position of the computing system in the rack.

7. The cam latching device of claim 1, wherein the locking mechanism is only transitioned to the unlocked configuration when the computing system is fully received into the rack.

8. A computing system operable to be installed in a rack, the computing system comprising:
   a chassis; and
   a cam latching device coupled with the chassis, the cam latching device including:
      a cam including a handle portion and an engagement portion, the cam including a locking surface formed thereon, wherein rotation of the handle portion causes the engagement portion to rotate; and
      a locking mechanism including a push component and a lock, the push component operable to abut against a button disposed on a rail of the rack as the computing system translates along a longitudinal axis to be installed in the rack, wherein when the push component slides against the button, the locking mechanism transitions from a locked configuration to an unlocked configuration,
      wherein when the locking mechanism is in the locked configuration, the lock is operable to abut against the locking surface to prevent the rotation of the handle portion and the engagement portion, and
      wherein when the locking mechanism is in the unlocked configuration, the lock is retracted away from the locking surface so that the handle portion and the engagement portion are rotatable.

9. The computing system of claim 8, wherein the locking mechanism includes one or more springs, wherein when the push component slides against the button to transition the locking mechanism to the unlocked configuration, the springs are compressed.

10. The computing system of claim 9, wherein when the push component does not contact the button, the one or more springs are not compressed and maintain the position of the lock against the locking surface of the cam.

11. The computing system of claim 9, wherein the locking mechanism includes a body coupled with the push component and the lock, wherein the body is configured to receive the one or more springs.

12. The computing system of claim 11, wherein when the push component slides against the button to transition the locking mechanism to the unlocked configuration, the body pushes against the one or more springs to compress the one or more springs and retracts the lock from the locking surface.

13. The computing system of claim 8, wherein when the handle portion is rotated, the engagement portion is rotated to engage with a guide disposed on the rack to maintain the position of the computing system in the rack.

14. The computing system of claim 13, wherein when the engagement portion is engaged with the guide, the handle portion abuts against the chassis.

15. The computing system of claim 8, wherein the locking mechanism is only transitioned to the unlocked configuration when the chassis is fully received into the rack.

16. The computing system of claim 8, wherein the handle portion is operable to receive a push force from a user to translate the chassis along the longitudinal axis into the rack.

17. A server system comprising:
   a rack including a plurality of rails and a button disposed on at least one of the rails;
   a computing system operable to be installed into the rack, the computing system including:
      a chassis operable to be received by the rails; and
      a cam latching device coupled with the chassis, the cam latching device including:
         a cam including a handle portion and an engagement portion, the cam including a locking surface formed thereon, wherein rotation of the handle portion causes the engagement portion to rotate; and
         a locking mechanism including a push component and a lock, the push component operable to abut against the button as the computing system translates along a longitudinal axis to be installed in the rack, wherein when the push component slides against the button, the locking mechanism transitions from a locked configuration to an unlocked configuration, wherein when the locking mechanism is in the locked configuration, the lock is operable to abut against the locking surface to prevent the rotation of the handle portion and the engagement portion, and wherein when the locking mechanism is in the unlocked configuration, the lock is retracted away from the locking surface so that the handle portion and the engagement portion are rotatable.

18. The server system of claim 17, wherein the locking mechanism includes one or more springs, wherein when the push component slides against the button to transition the locking mechanism to the unlocked configuration, the springs are compressed.

19. The server system of claim 18, wherein when the push component does not contact the button, the one or more springs are not compressed and maintain the position of the lock against the locking surface of the cam.

20. The server system of claim 17, wherein when the handle portion is rotated, the engagement portion is rotated to engage with a guide disposed on the rack to maintain the position of the computing system in the rack.

* * * * *